(12) United States Patent
Ishimaki et al.

(10) Patent No.: US 12,742,098 B2
(45) Date of Patent: Sep. 22, 2026

(54) CHEMICAL MECHANICAL POLISHING COMPOSITION AND POLISHING METHOD

(71) Applicant: JSR CORPORATION, Tokyo (JP)

(72) Inventors: Koki Ishimaki, Tokyo (JP); Shuhei Nakamura, Tokyo (JP); Yasutaka Kamei, Tokyo (JP); Kohei Nishimura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 202 days.

(21) Appl. No.: 18/577,266

(22) PCT Filed: Aug. 1, 2022

(86) PCT No.: PCT/JP2022/029476

§ 371 (c)(1),
(2) Date: Jan. 7, 2024

(87) PCT Pub. No.: WO2023/026778

PCT Pub. Date: Mar. 2, 2023

(65) Prior Publication Data

US 2024/0254365 A1 Aug. 1, 2024

(30) Foreign Application Priority Data

Aug. 24, 2021 (JP) ................................ 2021-136291

(51) Int. Cl.
*C09G 1/02* (2006.01)
*B24B 1/00* (2006.01)
(Continued)

(52) U.S. Cl.
CPC ................. *C09G 1/02* (2013.01); *B24B 1/00* (2013.01); *B24B 37/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H10P 52/00* (2026.01); *H10P 52/402* (2026.01); *H10P 52/403* (2026.01); *H10W 20/062* (2026.01)

(58) Field of Classification Search
None
See application file for complete search history.

(56) References Cited

U.S. PATENT DOCUMENTS

2021/0301176 A1* 9/2021 Soumiya ........... H01L 21/30625

FOREIGN PATENT DOCUMENTS

CN 112920717 6/2021
CN 1121920717 * 6/2021 ............ B24B 29/02
(Continued)

OTHER PUBLICATIONS

J.A.A. Junior et al., "The Behavior of Zeta Potential of Silica Suspensions", New Journal of Glass and Ceramics, vol. 4, pp. 29-37. (Year: 2014).*

(Continued)

*Primary Examiner* — Jiong-Ping Lu
(74) *Attorney, Agent, or Firm* — JCIPRNET

(57) ABSTRACT

The present invention provides a chemical mechanical polishing composition with which it is possible to suppress ruthenium corrosion and also perform chemical mechanical polishing of a semiconductor substrate containing ruthenium while maintaining a stable polishing speed. The composition for chemical mechanical polishing of the present invention contains: (A) abrasive grains; (B) an acid containing at least one anion selected from the group consisting of periodate ions ($IO_4^-$), hypochlorite ions ($ClO^-$), chlorite ions ($ClO_2^-$) and hypobromite ions ($BrO^-$) or a salt of said acid; and (C) hydrogen peroxide. MB/MC=0.015 to 11, where MB (mol/L) is the amount of the (B) acid or salt thereof and MC (mol/L) is the amount of hydrogen peroxide (C).

9 Claims, 2 Drawing Sheets

(51) Int. Cl.

| | |
|---|---|
| ***B24B 37/00*** | (2012.01) |
| ***B24B 37/04*** | (2012.01) |
| ***C09G 1/00*** | (2006.01) |
| ***C09G 1/04*** | (2006.01) |
| ***C09G 1/06*** | (2006.01) |
| ***C09K 3/14*** | (2006.01) |
| ***C09K 13/06*** | (2006.01) |
| ***H10P 52/00*** | (2026.01) |
| ***H10P 52/40*** | (2026.01) |
| ***H10W 20/00*** | (2026.01) . |

(56) References Cited

FOREIGN PATENT DOCUMENTS

| | | | | |
|---|---|---|---|---|
| EP | 3792327 | * | 3/2021 | C09K 3/14 |
| JP | 2003037086 | | 2/2003 | |
| JP | 2007311586 | | 11/2007 | |
| JP | 2009514219 | | 4/2009 | |
| JP | 2010535424 | | 11/2010 | |
| JP | 4846445 | * | 12/2011 | B24B 37/00 |
| JP | 2016030778 | | 3/2016 | |
| JP | 2020096190 | | 6/2020 | |
| WO | 2019151145 | | 8/2019 | |

OTHER PUBLICATIONS

"International Search Report (Form PCT/ISA/210) of PCT/JP2022/029476", mailed on Oct. 25, 2022, with English translation thereof, pp. 1-4.

"Office Action of Taiwan Counterpart Application", issued on Aug. 13, 2025, with English translation thereof, p. 1-p. 10.

"Notice of Reasons for Refusal of Japan Counterpart Application", issued on Dec. 16, 2025, with English translation thereof, pp. 1-14.

* cited by examiner

CHEMICAL MECHANICAL POLISHING COMPOSITION AND POLISHING METHOD

CROSS-REFERENCE TO RELATED APPLICATION

This application is a 371 application of the International PCT application serial no. PCT/JP2022/029476, filed on Aug. 1, 2022, which claims the priority benefits of Japan Patent Application No. 2021-136291, filed on Aug. 24, 2021. The entirety of each of the above-mentioned patent applications is hereby incorporated by reference herein and made a part of this specification.

TECHNICAL FIELD

The present invention relates to a chemical mechanical polishing composition and a polishing method using the same.

BACKGROUND ART

Along with improvement in manufacturing techniques of semiconductor integrated circuits, there is a demand for the high integration and high-speed operation of semiconductor elements. Accordingly, stricter flatness of semiconductor substrate surfaces has been required in the manufacturing steps of fine circuits in semiconductor elements, and chemical mechanical polishing (CMP) has become an indispensable technique in the manufacturing steps of semiconductor elements.

CMP is a technique in which a chemical mechanical polishing composition is supplied onto a polishing pad stuck onto a surface plate, a semiconductor substrate is pressed on the chemical mechanical polishing composition and the semiconductor substrate and the polishing pad are made to slide on each other, thereby chemically and mechanically polishing the semiconductor substrate. In CMP, unevenness on semiconductor substrate surfaces is removed by a chemical reaction using a reagent and mechanical polishing using abrasive grains, and the surfaces can be flattened.

Recently, studies have been made regarding methods in which a ruthenium film is used to improve the embeddability of copper in recessed parts at the time of producing copper wires on semiconductor substrates that are manufactured through such CMP (for example, refer to Patent Literature 1 to 3).

CITATION LIST

Patent Literature

[Patent Literature 1]
Japanese Translation of PCT Application No. 2009-514219
[Patent Literature 2]
Japanese Translation of PCT Application No. 2010-535424
[Patent Literature 3]
International Publication No. WO 2019/151145

SUMMARY OF INVENTION

Technical Problem

In order to suppress the generation of highly volatile ruthenium tetroxide gas and polish ruthenium-containing parts in such CMP, there is a need to perform chemical mechanical polishing using a basic chemical mechanical polishing composition and a halogen-based oxidant having a high oxidizing power such as potassium periodate or potassium hypochlorite. However, the use of the basic chemical mechanical polishing composition makes it possible to suppress the generation of ruthenium tetroxide, but allows insufficiently oxidized ruthenium oxide to adhere to the surface of the polishing pad and degrade the polishing characteristics of the polishing pad. As a result, it becomes difficult to perform chemical mechanical polishing on semiconductor substrates containing ruthenium while maintaining a stable polishing speed. Incidentally, in the case of using the halogen-based oxidant having a high oxidizing power, there is a concern that ruthenium may be corroded.

Several aspects according to the present invention provide a chemical mechanical polishing composition with which it is possible to suppress ruthenium corrosion and also perform chemical mechanical polishing of a semiconductor substrate containing ruthenium while maintaining a stable polishing speed.

Solution to Problem

The present invention has been made to solve at least a part of the above-described problem and can be realized as any of the following aspects.

An aspect of a chemical mechanical polishing composition according to the present invention contains abrasive grains (A), an acid containing at least one anion selected from the group consisting of periodate ions ($IO_4^-$), hypochlorite ions ($ClO^-$), chlorite ions ($ClO_2^-$) and hypobromite ions ($BrO^-$) or a salt thereof (B), and hydrogen peroxide (C), in which MB/MC=0.015 to 11, where MB (mol/L) is an amount of the acid or salt thereof (B) and MC (mol/L) is an amount of hydrogen peroxide (C).

In an aspect of the chemical mechanical polishing composition, the abrasive grains (A) may have a functional group represented by the following general formula (1) or (2).

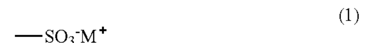

(1)

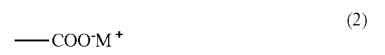

(2)

($M^+$ represents a monovalent cation.)

In an aspect of the chemical mechanical polishing composition, the abrasive grains (A) may have a functional group represented by the following general formula (3) or (4).

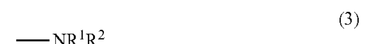

(3)

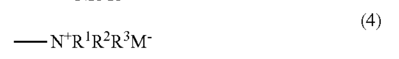

(4)

(In the formulae (3) and (4), $R^1$, $R^2$ and $R^3$ each independently represent a hydrogen atom or a substituted or unsubstituted hydrocarbon group. $M^-$ represents an anion.)

In any aspect of the chemical mechanical polishing composition, the abrasive grains (A) in the chemical mechanical polishing composition may have an absolute value of a zeta potential of 10 mV or higher.

In any aspect of the chemical mechanical polishing composition, the MB (mol/L) may be 0.001 to 0.05 mol/L.

In any aspect of the chemical mechanical polishing composition, pH may be 6 or higher and 12 or lower.

An aspect of a polishing method according to the present invention includes a step of polishing a semiconductor substrate using the chemical mechanical polishing composition of any of the aspects.

In an aspect of the polishing method, the semiconductor substrate may include a part composed of at least one selected from the group consisting of ruthenium and a ruthenium alloy.

Advantageous Effects of Invention

According to the chemical mechanical polishing composition according to the present invention, it is possible to suppress ruthenium corrosion and also perform chemical mechanical polishing of a semiconductor substrate containing ruthenium while maintaining a stable polishing speed.

DESCRIPTION OF EMBODIMENTS

Figures 1, 2, 3:
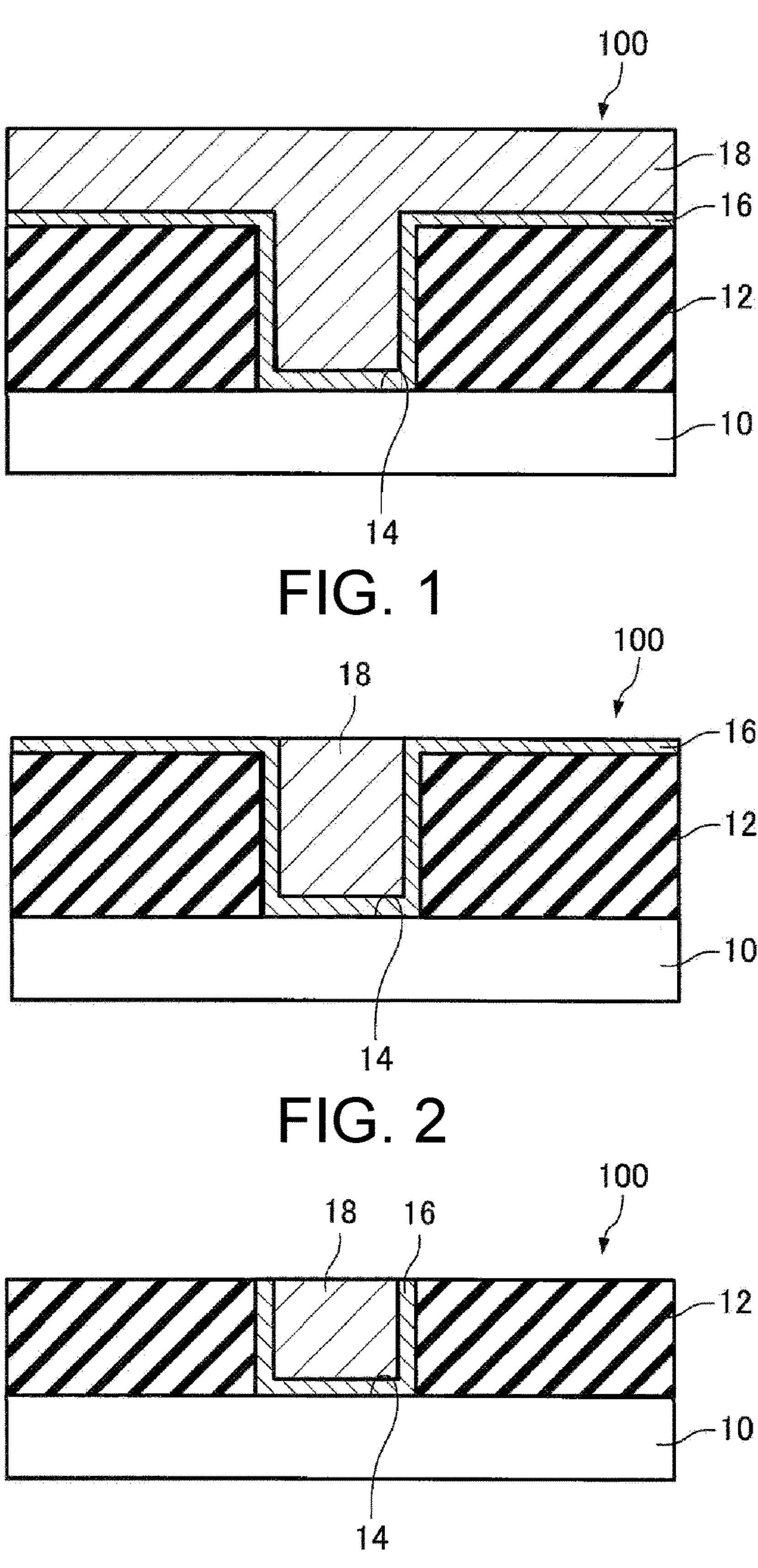
FIG. 1 is a cross-sectional view schematically showing an object to be treated suitable for use in a polishing step according to the present embodiment.
FIG. 2 is a cross-sectional view schematically showing the object to be treated at the time of the end of a first polishing step.
FIG. 3 is a cross-sectional view schematically showing the object to be treated at the time of the end of a second polishing step.

Hereinafter, suitable embodiments of the present invention will be described in detail. The present invention is not limited to the following embodiments and also includes a variety of modification examples that are performed within the scope of the gist of the present invention.

In the present specification, numerical ranges expressed as "A to B" are interpreted to include the numerical value A as the lower limit value and the numerical value B as the upper limit value.

1. Chemical Mechanical Polishing Composition

A chemical mechanical polishing composition of an embodiment of the present invention contains abrasive grains (A) (in the present specification, also referred to as "component (A)"), an acid containing at least one anion selected from the group consisting of periodate ions ($IO_4^-$), hypochlorite ions ($ClO^-$), chlorite ions ($ClO_2^-$) and hypobromite ions ($BrO^-$) or a salt of an acid thereof (B) (in the present specification, also referred to as "component (B)"), and hydrogen peroxide (C) (in the present specification, also referred to as "component (C)"), and MB/MC=0.015 to 11, where MB (mol/L) is the amount of the acid or salt thereof (B) and MC (mol/L) is the amount of hydrogen peroxide (C).

Hereinafter, each component that is contained in the chemical mechanical polishing composition according to the present embodiment will be described in detail.

1.1. Component (A)

The chemical mechanical polishing composition according to the present embodiment contains abrasive grains (A). Examples of the component (A) include inorganic particles of silica, ceria, alumina, zirconia, titania and the like, and, among these, silica particles are preferable. Examples of the silica particles include fumed silica, colloidal silica and the like, and, among these, colloidal silica is preferable. Colloidal silica is preferably used from the viewpoint of reducing a polishing defect such as scratches. As the colloidal silica, for example, colloidal silica manufactured by a method described in Japanese Patent Laid-Open No. 2003-109921 or the like can be used.

In a case where the component (A) is silica particles containing silica as a main component, the component (A) may further contain other components. Examples of the other components include an aluminum compound, a silicon compound and the like. When the silica particles further contain an aluminum compound or a silicon compound, since it is possible to decrease the surface hardness of the silica particles, there are cases where it is possible to further reduce the generation of polishing scratches or dishing on a surface to be polished while maintaining a stable polishing speed.

Examples of the aluminum compound include aluminum hydroxide, aluminum oxide (alumina), aluminum chloride, aluminum nitride, aluminum acetate, aluminum phosphate, aluminum sulfate, sodium aluminate, potassium aluminate and the like. Incidentally, examples of the silicon compound include silicon nitride, silicon carbide, silicates, silicones, silicon resins and the like.

The shape of the component (A) is not particularly limited and may be a spherical shape, a cocoon shape or a chain spherical shape. The component (A) may have a plurality of projections on the surface. Abrasive grains having a plurality of projections on the surface can be manufactured by applying a method described in, for example, Japanese Patent Laid-Open No. 2007-153732 or Japanese Patent Laid-Open No. 2013-121631.

The absolute value of the zeta potential of the component (A) is preferably 10 mV or higher, more preferably 15 mV or higher and particularly preferably 20 mV or higher in the chemical mechanical polishing composition. When the absolute value of the zeta potential of the component (A) is within the above-described range, it is possible to effectively prevent the aggregation of particles due to electrostatic repulsion between the abrasive grains and to polish semiconductor substrates containing ruthenium at a more stable polishing speed. Examples of a zeta potential measuring instrument include "ELSZ-2000ZS" manufactured by Otsuka Electronics Co., Ltd., "Zetasizer Ultra" manufactured by Malvern Panalytical Ltd., "DT300" manufactured by Dispersion Technology Inc. and the like.

When the total mass of the chemical mechanical polishing composition is set to 100 mass %, the amount of the component (A) is preferably 0.1 mass % or more, more preferably 0.3 mass % or more and particularly preferably 0.5 mass % or more. When the total mass of the chemical mechanical polishing composition is set to 100 mass %, the amount of the component (A) is preferably 10 mass % or less, more preferably 8 mass % or less and particularly preferably 5 mass % or less. When the amount of the component (A) is within the above-described range, it is possible to polish semiconductor substrates containing ruthenium at a stable polishing speed, and there are cases where the preservation stability of the chemical mechanical polishing composition becomes favorable.

The component (A) is preferably abrasive grains in which at least a part of the surface is modified with a functional group. Since abrasive grains in which at least a part of the surface is modified with a functional group have a high absolute value of the zeta potential compared with abrasive grains in which the surface is not modified with a functional group, electrostatic repulsion between the abrasive grains increases. As a result, the dispersibility of the abrasive grains in the chemical mechanical polishing composition improves, and high-speed polishing is thus possible while reducing the generation of polishing scratches or dishing.

The component (A) may have, for example, a functional group represented by the following general formula (1).

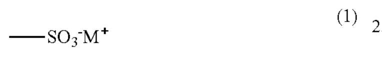

(1)

($M^+$ represents a monovalent cation.)

Examples of the monovalent cation represented by $M^+$ in the general formula (1) include $H^+$, $Li^+$, $Na^+$, $K^+$ and $NH_4^+$ while the monovalent cation is not limited thereto. That is, the functional group represented by the general formula (1) can also be said to be "at least one functional group selected from the group consisting of a sulfo group and salts thereof." Here, "salts of a sulfo group" refers to functional groups obtained by substituting the hydrogen ion that is contained in a sulfo group (—$SO_3H$) with a monovalent cation such as $Li^+$, $Na^+$, $K^+$ or $NH_4^+$. The component (A) having the functional group represented by the general formula (1) is abrasive grains in which the functional group represented by the general formula (1) is fixed to the surface through a covalent bond, and abrasive grains in which a compound having the functional group represented by the general formula (1) is physically or ionically adsorbed to the surface are not considered as the component (A) having the functional group represented by the general formula (1).

The component (A) having the functional group represented by the general formula (1) can be manufactured as described below. First, silica produced by a well-known method and a mercapto group-containing silane coupling agent are sufficiently stirred in an acidic medium, thereby covalently bonding the mercapto group-containing silane coupling agent to the surface of silica. Here, examples of the mercapto group-containing silane coupling agent include 3-mercaptopropylmethyldimethoxysilane, 3-mercaptopropyltrimethoxysilane and the like. Next, an appropriate amount of hydrogen peroxide is further added thereto, and the components are left to stand, whereby the component (A) having the functional group represented by the general formula (1) can be obtained.

The zeta potential of the component (A) having the functional group represented by the general formula (1) is a negative potential in the chemical mechanical polishing composition, and the negative potential is preferably −10 mV or lower, more preferably −15 mV or lower and particularly preferably −20 mV or lower. When the zeta potential of the component (A) is within the above-described range, there are cases where it is possible to effectively prevent the aggregation of particles due to electrostatic repulsion between the abrasive grains and to polish semiconductor substrates containing ruthenium at a more stable polishing speed. As a zeta potential measuring instrument, the above-described device can be used. The zeta potential of the component (A) can be adjusted by appropriately increasing or decreasing the amount of the mercapto group-containing silane coupling agent or the like added.

In a case where the chemical mechanical polishing composition according to the present embodiment contains the component (A) having the functional group represented by the general formula (1), when the total mass of the chemical mechanical polishing composition is set to 100 mass %, the amount of the component (A) is preferably 0.5 mass % or more and more preferably 1 mass % or more. When the total mass of the chemical mechanical polishing composition is set to 100 mass %, the amount of the component (A) is preferably 10 mass % or less and more preferably 5 mass % or less. When the amount of the component (A) having the functional group represented by the general formula (1) is within the above-described range, it is possible to polish semiconductor substrates containing ruthenium at a stable polishing speed, and there are cases where the preservation stability of the chemical mechanical polishing composition becomes favorable.

The component (A) may have, for example, a functional group represented by the following general formula (2).

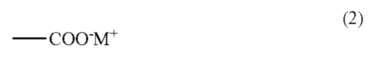

(2)

($M^+$ represents a monovalent cation.)

Examples of the monovalent cation represented by $M^+$ in the general formula (2) include $H^+$, $Li^+$, $Na^+$, $K^+$ and $NH_4^+$ while the monovalent cation is not limited thereto. That is, the functional group represented by the general formula (2) can also be said to be "at least one functional group selected from the group consisting of a carboxy group and salts thereof." Here, "salts of a carboxy group" refers to functional groups obtained by substituting the hydrogen ion that is contained in a carboxy group (—COOH) with a monovalent cation such as $Li^+$, $Na^+$, $K^+$ or $NH_4^+$. The component (A) having the functional group represented by the general formula (2) is abrasive grains in which the functional group represented by the general formula (2) is fixed to the surface through a covalent bond, and abrasive grains in which a compound having the functional group represented by the general formula (2) is physically or ionically adsorbed to the surface are not considered as the component (A) having the functional group represented by the general formula (2).

The component (A) having the functional group represented by the general formula (2) can be manufactured as described below. First, silica produced by a well-known method and a carboxylic acid anhydride-containing silane coupling agent are sufficiently stirred in a basic medium, and the carboxylic acid anhydride-containing silane coupling agent is covalently bonded to the surfaces of abrasive grains, whereby abrasive grains having the functional group represented by the general formula (2) can be obtained. Here, examples of the carboxylic acid anhydride-containing silane coupling agent include 3-(triethoxysilyl)propylsuccinic anhydride and the like.

The zeta potential of the component (A) having the functional group represented by the general formula (2) is a negative potential in the chemical mechanical polishing composition, and the negative potential is preferably −10 mV or lower, more preferably −15 mV or lower and particularly preferably −20 mV or lower. When the zeta potential of the component (A) is within the above-described range, there are cases where it is possible to effectively prevent the aggregation of particles due to electrostatic repulsion between the abrasive grains and to polish semiconductor substrates containing ruthenium at a more stable polishing speed. As a zeta potential measuring instrument, the above-described device can be used. The zeta potential of the component (A) having the functional group represented by the general formula (2) can be adjusted by appropriately increasing or decreasing the amount of the carboxylic acid anhydride-containing silane coupling agent or the like added.

In a case where the chemical mechanical polishing composition according to the present embodiment contains the component (A) having the functional group represented by the general formula (2), when the total mass of the chemical mechanical polishing composition is set to 100 mass %, the amount of the component (A) is preferably 0.1 mass % or more, more preferably 0.3 mass % or more and particularly preferably 0.5 mass % or more. When the total mass of the chemical mechanical polishing composition is set to 100 mass %, the amount of the component (A) is preferably 10 mass % or less, more preferably 8 mass % or less and particularly preferably 5 mass % or less. When the amount of the component (A) is within the above-described range, it is possible to polish semiconductor substrates containing ruthenium at a stable polishing speed, and there are cases where the preservation stability of the chemical mechanical polishing composition becomes favorable.

The component (A) may have, for example, a functional group represented by the following general formula (3) and/or the following general formula (4).

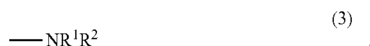 (3)

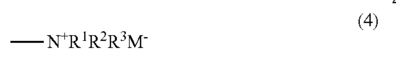 (4)

(In the formula (3) and the formula (4), $R^1$, $R^2$ and $R^3$ each independently represent a hydrogen atom or a substituted or unsubstituted hydrocarbon group. $M^-$ represents an anion.)

The functional group represented by the general formula (3) represents an amino group, and the functional group represented by the general formula (4) represents a salt of an amino group. Therefore, the functional group represented by the general formula (3) and the functional group represented by the general formula (4) can also be collectively said to be "at least one functional group selected from the group consisting of an amino group and salts thereof." The component (A) having the functional group represented by the general formula (3) and/or the general formula (4) is abrasive grains in which the functional group represented by the general formula (3) and/or the functional group (4) is fixed to the surface through a covalent bond, and abrasive grains in which a compound having the functional group represented by the general formula (3) and/or the functional group (4) is physically or ionically adsorbed to the surface are not considered as the component (A) having the functional group represented by the general formula (3) and/or the functional group (4).

Examples of the anion represented by $M^-$ in the general formula (4) include not only anions such as $OH^-$, $F^-$, $Cl^-$, $Br^-$, $I^-$ and $CN^-$ but also anions derived from an acidic compound while the anion is not limited thereto.

In the general formula (3) and the general formula (4), $R^1$ to $R^3$ each independently represent a hydrogen atom or a substituted or unsubstituted hydrocarbon group, but two or more of $R^1$ to $R^3$ may bond together to form a ring structure.

The hydrocarbon groups represented by $R^1$ to $R^3$ may be any of aliphatic hydrocarbon groups, aromatic hydrocarbon groups, aromatic aliphatic hydrocarbon groups or alicyclic hydrocarbon groups. In addition, the aliphatic in the aliphatic hydrocarbon groups and the aromatic aliphatic hydrocarbon groups may be saturated or unsaturated and may be linear or branched. Examples of these hydrocarbon groups include linear, branched or cyclic alkyl groups, alkenyl groups, aralkyl groups, aryl groups and the like.

The alkyl groups are preferably lower alkyl groups having 1 to 6 carbon atoms and more preferably lower alkyl groups having 1 to 4 carbon atoms. Examples of such alkyl groups include a methyl group, an ethyl group, a n-propyl group, an iso-propyl group, a n-butyl group, an iso-butyl group, a sec-butyl group, a tert-butyl group, a n-pentyl group, an iso-pentyl group, a sec-pentyl group, a tert-pentyl group, a neopentyl group, a n-hexyl group, an iso-hexyl group, a sec-hexyl group, a tert-hexyl group, a cyclopentyl group, a cyclohexyl group and the like.

The alkenyl groups are preferably lower alkenyl groups having 1 to 6 carbon atoms and more preferably lower alkenyl groups having 1 to 4 carbon atoms. Examples of such alkenyl groups include a vinyl group, a n-propenyl group, an iso-propenyl group, a n-butenyl group, an iso-butenyl group, a sec-butenyl group, a tert-butenyl group and the like.

The aralkyl groups are preferably aralkyl groups having 7 to 12 carbon atoms. Examples of such aralkyl groups include a benzyl group, a phenethyl group, a phenylpropyl group, a phenylbutyl group, a phenylhexyl group, a methylbenzyl group, a methylphenethyl group, an ethylbenzyl group and the like.

The aryl groups are preferably aryl groups having 6 to 14 carbon atoms. Examples of such aryl groups include a phenyl group, an o-tolyl group, an m-tolyl group, a p-tolyl group, a 2,3-xylyl group, a 2,4-xylyl group, a 2,5-xylyl group, a 2,6-xylyl group, a 3,5-xylyl group, a naphthyl group, an anthryl group and the like.

The aromatic rings in the aryl groups and aralkyl groups may have, for example, a lower alkyl group such as a methyl group or an ethyl group, a halogen atom, a nitro group, an amino group, a hydroxy group or the like as a substituent.

As the component (A) having the functional group represented by the general formula (3) and/or the general formula (4), abrasive grains having the functional group represented by the general formula (3) and/or the general formula (4) can be manufactured by, for example, sufficiently stirring silica and an amino group-containing silane coupling agent in an acidic medium and covalently bonding the amino group-containing silane coupling agent to the surface of silica. Here, examples of the amino group-containing silane coupling agent include 3-aminopropyltrimethoxysilane, 3-aminopropyltriethoxysilane and the like.

The zeta potential of the component (A) having the functional group represented by the general formula (3) and/or the general formula (4) is a negative potential in the chemical mechanical polishing composition, and the negative potential is preferably −10 mV or lower and more preferably −15 mV or lower. When the zeta potential of the component (A) is within the above-described range, there are cases where it is possible to effectively prevent the aggregation of particles due to electrostatic repulsion between the abrasive grains and to polish semiconductor substrates containing ruthenium at a more stable polishing speed. As a zeta potential measuring instrument, the above-described device can be used. The zeta potential of the component (A) having the functional group represented by the general formula (3) and/or the general formula (4) can be adjusted by appropriately increasing or decreasing the amount of the amino group-containing silane coupling agent or the like added.

In a case where the chemical mechanical polishing composition according to the present embodiment contains the component (A) having the functional group represented by the general formula (3) and/or the general formula (4), when the total mass of the chemical mechanical polishing composition is set to 100 mass %, the amount of the component (A) is preferably 0.1 mass % or more, more preferably 0.5 mass % or more and particularly preferably 1 mass % or more. When the total mass of the chemical mechanical polishing composition is set to 100 mass %, the amount of the component (A) is preferably 10 mass % or less, more preferably 8 mass % or less and particularly preferably 5 mass % or less. When the amount of the component (A) is within the above-described range, it is possible to polish semiconductor substrates containing ruthenium at a stable polishing speed, and there are cases where the preservation stability of the chemical mechanical polishing composition becomes favorable.

1.2. Component (b)

The chemical mechanical polishing composition according to the present embodiment contains an acid containing at least one anion selected from the group consisting of periodate ions ($IO_4^-$), hypochlorite ions ($ClO^-$), chlorite ions ($ClO_2^-$) and hypobromite ions ($BrO^-$) (hereinafter, also referred to as "specific anion species") or a salt thereof (B). The anion that is contained in the component (B) is assumed to function as an oxidant and oxidize ruthenium to accelerate polishing.

Specific examples of the component (B) include periodic acid, chlorous acid, hypochlorous acid, hypobromous acid, sodium periodate, potassium periodate, ammonium periodate, sodium chlorite, potassium chlorite, sodium hypochlorite, potassium chlorite, sodium hypobromite and the like. Among these, at least one compound selected from the group consisting of periodic acid, potassium chlorite, potassium hypochlorite and sodium hypobromite is preferable and periodic acid is more preferable. These components (B) may be used singly or two or more thereof may be used in combination.

The amount [MB (mol/L)] of the component (B) is preferably 0.001 mol/L or more, more preferably 0.002 mol/L or more and particularly preferably 0.003 mol/L or more relative to 1 L of the chemical mechanical polishing composition. The amount [MB (mol/L)] of the component (B) is preferably 0.05 mol/L or less, more preferably 0.04 mol/L or less and particularly preferably 0.035 mol/L or less relative to 1 L of the chemical mechanical polishing composition. When the amount of the component (B) is within the above-described range, there are cases where it is possible to oxidize ruthenium to accelerate polishing and to prevent the excessive reaction between ruthenium and the specific anion species and suppress ruthenium corrosion.

When the total mass of the chemical mechanical polishing composition is set to 100 mass %, the amount (mass %) of the component (B) is preferably 0.01 mass % or more, more preferably 0.05 mass % or more and particularly preferably 0.1 mass % or more. When the total mass of the chemical mechanical polishing composition is set to 100 mass %, the amount (mass %) of the component (B) is preferably 10 mass % or less, more preferably 8 mass % or less and particularly preferably 7 mass % or less. When the amount of the component (B) is within the above-described range, there are cases where it is possible to oxidize ruthenium to accelerate polishing and to prevent the excessive reaction between ruthenium and the specific anion species and suppress ruthenium corrosion.

1.3. Component (C)

The chemical mechanical polishing composition according to the present embodiment contains hydrogen peroxide (C). The hydrogen peroxide (C) oxidizes ruthenium to accelerate polishing, and the component (C) has a function of suppressing the generation of halogen gases or ruthenium corrosion by reacting with ruthenium to prevent the excessive reaction between ruthenium and the specific anion species that is contained in the component (B).

The amount [MC (mol/L)] of the component (C) is preferably 0.0005 mol/L or more, more preferably 0.0009 mol/L or more and particularly preferably 0.0012 mol/L or more relative to 1 L of the chemical mechanical polishing composition. The amount [MC (mol/L)] of the component (C) is preferably 0.5 mol/L or less, more preferably 0.4 mol/L or less and particularly preferably 0.3 mol/L or less relative to 1 L of the chemical mechanical polishing composition. When the amount of the component (C) is within the above-described range, there are cases where ruthenium is oxidized to accelerate polishing and the component (C) reacts with ruthenium, whereby the excessive reaction between ruthenium and the specific anion species that is contained in the component (B) is prevented, and ruthenium corrosion can be suppressed.

When the total mass of the chemical mechanical polishing composition is set to 100 mass %, the amount (mass %) of the component (C) is preferably 0.0017 mass % or more, more preferably 0.003 mass % or more and particularly preferably 0.004 mass % or more. When the total mass of the chemical mechanical polishing composition is set to 100 mass %, the amount (mass %) of the component (C) is preferably 1.7 mass % or less, more preferably 1.4 mass % or less and particularly preferably 1 mass % or less. When the amount of the component (C) is within the above-described range, there are cases where ruthenium is oxidized to accelerate polishing and the component (C) reacts with ruthenium, whereby the excessive reaction between ruthenium and the specific anion species that is contained in the component (B) is prevented, and ruthenium corrosion can be suppressed.

When the MB (mol/L) is the amount of the acid or salt thereof (B) and MC (mol/L) is the amount of the hydrogen peroxide (C), the MB/MC value is preferably 0.015 or more, more preferably 0.02 or more and particularly preferably 0.1 or more. The MB/MC value is preferably 11 or less, more preferably 10.5 or less and particularly preferably 10 or less. When the MB/MC value is within the above-described range, it is possible to accelerate polishing by oxidizing ruthenium, and there are cases where the component (C) reacts with ruthenium, whereby the excessive reaction between ruthenium and the specific anion species that is contained in the component (B) is prevented, and ruthenium corrosion can be suppressed.

1.4. Component (D)

The chemical mechanical polishing composition according to the present embodiment may contain a compound (D) having at least one functional group selected from the group consisting of an amino group and a salt thereof and at least one functional group selected from the group consisting of a carboxy group and a salt thereof (in the present specification, also referred to as "component (D)").

Examples of the amino group and the salt thereof include functional groups represented by the following general formula (5) or the following general formula (6).

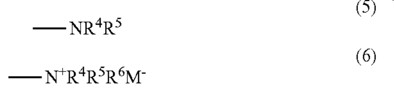

(In the formula (5) and the formula (6), $R^4$, $R^5$ and $R^6$ each independently represent a hydrogen atom or a substituted or unsubstituted hydrocarbon group. $M^-$ represents an anion.)

In the general formula (5) and the general formula (6), $R^4$ to $R^6$ each independently represent a hydrogen atom or a substituted or unsubstituted hydrocarbon group, but two or more of $R^4$ to $R^6$ may bond together to form a ring structure.

The hydrocarbon groups represented by $R^4$ to $R^6$ may be any of aliphatic hydrocarbon groups, aromatic hydrocarbon groups, aromatic aliphatic hydrocarbon groups or alicyclic hydrocarbon groups. In addition, the aliphatic in the aliphatic hydrocarbon groups and the aromatic aliphatic hydrocarbon groups may be saturated or unsaturated and may be linear or branched. Examples of these hydrocarbon groups include linear, branched or cyclic alkyl groups, alkenyl groups, aralkyl groups, aryl groups and the like.

The alkyl groups are preferably lower alkyl groups having 1 to 6 carbon atoms and more preferably lower alkyl groups having 1 to 4 carbon atoms. Examples of such alkyl groups include a methyl group, an ethyl group, a n-propyl group, an iso-propyl group, a n-butyl group, an iso-butyl group, a sec-butyl group, a tert-butyl group, a n-pentyl group, an iso-pentyl group, a sec-pentyl group, a tert-pentyl group, a neopentyl group, a n-hexyl group, an iso-hexyl group, a sec-hexyl group, a tert-hexyl group, a cyclopentyl group, a cyclohexyl group and the like.

The alkenyl groups are preferably lower alkenyl groups having 1 to 6 carbon atoms and more preferably lower alkenyl groups having 1 to 4 carbon atoms. Examples of such alkenyl groups include a vinyl group, a n-propenyl group, an iso-propenyl group, a n-butenyl group, an iso-butenyl group, a sec-butenyl group, a tert-butenyl group and the like.

The aralkyl groups are preferably aralkyl groups having 7 to 12 carbon atoms. Examples of such aralkyl groups include a benzyl group, a phenethyl group, a phenylpropyl group, a phenylbutyl group, a phenylhexyl group, a methylbenzyl group, a methylphenethyl group, an ethylbenzyl group and the like.

The aryl groups are preferably aryl groups having 6 to 14 carbon atoms. Examples of such aryl groups include a phenyl group, an o-tolyl group, an m-tolyl group, a p-tolyl group, a 2,3-xylyl group, a 2,4-xylyl group, a 2,5-xylyl group, a 2,6-xylyl group, a 3,5-xylyl group, a naphthyl group, an anthryl group and the like.

The aromatic rings in the aryl groups and the aralkyl groups may have, for example, a lower alkyl group such as a methyl group or an ethyl group, a halogen atom, a nitro group, an amino group, a hydroxy group or the like as a substituent.

Examples of the carboxy group and the salt thereof include functional groups represented by the following general formula (7).

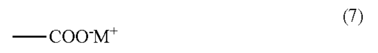

($M^+$ represents a monovalent cation.)

Examples of the monovalent cation represented by $M^+$ in the general formula (7) include $H^+$, $Li^+$, $Na^+$, $K^+$ and $NH_4^+$ while the monovalent cation is not limited thereto.

The component (D) is not particularly limited as long as the component (D) is a structure having at least one functional group selected from the group consisting of an amino group and a salt thereof and at least one functional group selected from the group consisting of a carboxy group and a salt thereof, but preferably has a structure represented by the following general formula (8).

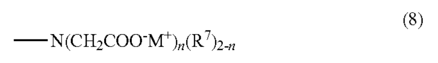

(In the formula (8), $R^7$ represents a hydrogen atom or a substituted or unsubstituted hydrocarbon group. $M^+$ represents a monovalent cation. n represents an integer of 1 or 2.)

Examples of the hydrocarbon group represented by $R^7$ in the general formula (8) include the same hydrocarbon groups as the hydrocarbon groups exemplified as $R^4$ to $R^6$ in the general formulae (6) and (7). Examples of the monovalent cation represented by $M^+$ in the general formula (8) include $H^+$, $Li^+$, $Na^+$, $K^+$ and $NH_4^+$ while the monovalent cation is not limited thereto.

When the component (D) has the structure represented by the general formula (8), the component (D) effectively coordinates and adsorbs to the ruthenium surface to form a protective film, whereby excessive corrosion of ruthenium parts can be suppressed.

Examples of the component (D) include N-(phosphonomethyl)iminodiacetic acid, hydroxyethyliminodiacetic acid, nitrilotriacetic acid, N-(2-carboxyethyl)iminodiacetic acid, ethylenediaminetetraacetic acid, tetrasodium L-glutamic acid diacetate, glycine-N,N-bis(methylenephosphonic acid), 3,3',3"-nitrilotripropionic acid, glycol ether diamine tetraacetic acid, hydroxyethylethylenediamine triacetic acid, 1,3-propanediamine-N,N,N',N'-tetraacetic acid, triethylenetetraaminehexaacetic acid, dihydroxyethylglycine, (S,S)-ethylenediaminedisuccinic acid trihydrate, iminodiacetic acid, trans-1,2-diaminocyclohexane-N,N,N',N'-tetraacetic acid hydrate and the like. These component (D) may be used singly or two or more thereof may be used in combination.

When the total mass of the chemical mechanical polishing composition is set to 100 mass %, the amount (mass %) of the component (D) is preferably 0.05 mass % or more, more preferably 0.1 mass % or more and particularly preferably 0.15 mass % or more. When the total mass of the chemical mechanical polishing composition is set to 100 mass %, the amount (mass %) of the component (D) is preferably 5 mass % or less, more preferably 2 mass % or less and particularly preferably 1 mass % or less. When the amount of the component (D) is within the above-described range, there are cases where it is possible to effectively suppress the excessive corrosion of semiconductor substrates containing ruthenium.

1.5. Other Components

The chemical mechanical polishing composition according to the present embodiment may contain, aside from each of the above-described components, a liquid medium, a water-soluble polymer, a nitrogen-containing heterocyclic compound, a surfactant, an organic acid and a salt thereof, an inorganic acid and a salt thereof, a basic compound or the like as necessary.

<Liquid Medium>

The chemical mechanical polishing composition according to the present embodiment contains a liquid medium. Examples of the liquid medium include water, mixed media of water and an alcohol, mixed media containing water and an organic solvent that is compatible with water and the like. Among these, water or a mixed medium of water and an alcohol is preferably used, and water is more preferably used. As a raw material of the water, pure water can be preferably used. The liquid medium may be blended as a remainder of each of the above-described components.

<Water-Soluble Polymer>

The chemical mechanical polishing composition according to the present embodiment contains a water-soluble polymer. The water-soluble polymer is capable of reducing the occurrence of dishing on a surface to be polished by adsorbing to the surface of the surface to be polished and decreasing polishing friction in some cases.

Specific examples of the water-soluble polymer include polycarboxylic acid, polystyrene sulfonic acid, polyacrylic acid, polymethacrylic acid, polyether, polyacrylamide, polyvinyl alcohol, polyvinylpyrrolidone, polyethyleneimine, polyallylamine, hydroxyethyl cellulose and the like. These can be used singly or two or more thereof can be used in combination.

The weight-average molecular weight (Mw) of the water-soluble polymer is preferably 10,000 or higher and 1,500,000 or lower and more preferably 40,000 or higher and 1,200,000 or lower. Here, "weight-average molecular weight" refers to a polyethylene glycol-equivalent weight-average molecular weight measured by gel permeation chromatography (GPC).

In a case where the chemical mechanical polishing composition according to the present embodiment contains the water-soluble polymer, the amount of the water-soluble polymer is preferably 0.001 mass % or more and more preferably 0.002 mass % or more when the total mass of the chemical mechanical polishing composition is set to 100 mass %. The amount of the water-soluble polymer is preferably 0.1 mass % or less and more preferably 0.01 mass % or less when the total mass of the chemical mechanical polishing composition is set to 100 mass %.

<Nitrogen-Containing Heterocyclic Compound>

The nitrogen-containing heterocyclic compound is an organic compound including at least one heterocycle selected from a five-membered heterocycle and a six-membered heterocycle having at least one nitrogen atom. Specific examples of the heterocycle include five-membered heterocycles such as a pyrrole structure, an imidazole structure and a triazole structure; and six-membered heterocycles such as a pyridine structure, a pyrimidine structure, a pyridazine structure and a pyrazine structure. The heterocycle may form a condensed ring. Specific examples thereof include an indole structure, an isoindole structure, a benzimidazole structure, a benzotriazole structure, a quinoline structure, an isoquinoline structure, a quinazoline structure, a cinnoline structure, a phthalazine structure, a quinoxaline structure, an acridine structure and the like. Among heterocyclic compounds having such a structure, cyclic compounds having a pyridine structure, a quinoline structure, a benzimidazole structure or a benzotriazole structure are preferable.

Specific examples of the nitrogen-containing heterocyclic compound include aziridine, pyridine, pyrimidine, pyrrolidine, piperidine, pyrazine, triazine, pyrrole, imidazole, indole, quinoline, isoquinoline, benzoisoquinoline, purine, pteridine, triazole, triazolidine, benzotriazole, carboxybenzotriazole and derivatives having these skeletons. Among these, at least one selected from the group consisting of benzotriazole and triazole is preferable. These nitrogen-containing heterocyclic compounds may be used singly or two or more thereof may be used in combination.

<Surfactant>

The surfactant is not particularly limited, and anionic surfactants, cationic surfactants, non-ionic surfactants and the like can be used. Examples of the anionic surfactants include sulfates such as alkyl ether sulfate and polyoxyethylene alkyl phenyl ether sulfate; fluorine-containing surfactants such as a perfluoroalkyl compound; and the like. Examples of the cationic surfactants include aliphatic amine salts, aliphatic ammonium salts and the like. Examples of the non-ionic surfactants include non-ionic surfactants having a triple bond such as acetylene glycol, acetylene glycol ethylene oxide adducts and acetylene alcohols; polyethylene glycol-type surfactants and the like. These surfactants may be used singly or two or more surfactants may be used in combination.

<Organic Acid and Salt Thereof>

The chemical mechanical polishing composition according to the present embodiment may contain at least one selected from the group consisting of an organic acid and a salt thereof (excluding the component (D)). The organic acid and a salt thereof are capable of improving the polishing speed of semiconductor substrates containing ruthenium due to a synergistic effect with the component (A) in some cases.

The organic acid and the salt thereof are preferably compounds having a carboxy group or compounds having a sulfo group. Examples of the compounds having a carboxy group include stearic acid, lauric acid, oleic acid, myristic, alkenyl succinic acid, lactic acid, tartaric acid, fumaric acid, glycolic acid, phthalic acid, maleic acid, formic acid, acetic acid, oxalic acid, citric acid, malic acid, malonic acid, glutaric acid, succinic acid, benzoic acid, quinolinic acid, quinaldic acid, amidosulfonic acid, propionic acid and trifluoroacetic acid; amino acids such as glycine, alanine, aspartic acid, glutamic acid, lysine, arginine, tryptophan, dodecylaminoethylaminoethylglycine, aromatic amino acid and heterocyclic amino acids; imino acids such as alkyl iminodicarboxylic acid; and salts thereof. Examples of the compounds having a sulfo group include alkyl benzenesulfonic acids such as dodecylbenzenesulfonic acid and p-toluenesulfonic acid; alkyl naphthalenesulfonic acid such as butyl naphthalene sulfonic acid; α-olefin sulfonic acids such as tetradecenesulfonic acid; and salts thereof. These compounds may be used singly or two or more thereof may be used in combination.

In a case where the chemical mechanical polishing composition according to the present embodiment contains the organic acid (salt), the amount of the organic acid (salt) is preferably 0.001 mass % or more and more preferably 0.01 mass % or more when the total mass of the chemical mechanical polishing composition is set to 100 mass %. The amount of the organic acid (salt) is preferably 5 mass % or less and more preferably 1 mass % or less when the total mass of the chemical mechanical polishing composition is set to 100 mass %.

<Inorganic Acid and Salt Thereof>

The inorganic acid is preferably at least one selected from the group consisting of hydrochloric acid, nitric acid, sulfuric acid, phosphoric acid and salts thereof. The inorganic acid may form a salt with a separately added base in the chemical mechanical polishing composition.

<Basic Compound>

Examples of the basic compound include organic bases and inorganic bases. The organic bases are preferably amines, and examples thereof include triethylamine, monoethanolamine, tetramethyl ammonium hydroxide, tetraethyl ammonium hydroxide, tetrabutyl ammonium hydroxide, benzylamine, methylamine, ethylenediamine, diglycolamine, isopropylamine and the like. Examples of the inorganic bases include ammonia, potassium hydroxide, sodium hydroxide and the like. Among these basic compounds, ammonia and potassium hydroxide are preferable. These basic compounds may be used singly or two or more thereof may be used in combination.

1.6. pH

The pH of the chemical mechanical polishing composition according to the present embodiment is preferably 6.0 or higher, more preferably 6.5 or higher and particularly preferably 7.0 or higher. The pH of the chemical mechanical polishing composition according to the present embodiment is preferably 12.0 or lower, more preferably 11.0 or lower and particularly preferably 10.0 or lower. When the pH is within the above-described range, there are cases where it is possible to effectively suppress the generation of ruthenium tetroxide gases or ruthenium corrosion.

The pH of the chemical mechanical polishing composition can be adjusted by, for example, adding the above-described organic acid (salt), inorganic acid (salt), basic compound or the like, and one or more thereof can be used.

In the present invention, the pH refers to the hydrogen-ion exponent pH, and the value thereof can be measured using a commercially available pH meter (for example, manufactured by HORIBA Advanced Techno, Co., Ltd., benchtop pH meter).

1.7. Method for Preparing Chemical Mechanical Polishing Composition

The chemical mechanical polishing composition according to the present embodiment can be prepared by dissolving or dispersing each of the above-described components in a liquid medium such as water. A method for dissolution or dispersion is not particularly limited, and any method by which the components can be uniformly dissolved or dispersed may be applied. In addition, a mixing order or mixing method of each of the above-described components is also not particularly limited.

In addition, the chemical mechanical polishing composition can also be prepared as a concentrated undiluted solution and be diluted with a liquid medium and used at the time of using the chemical mechanical polishing composition.

2. Polishing Method

A polishing method according to an embodiment of the present invention includes a step of polishing a semiconductor substrate using the above-described chemical mechanical polishing composition. The chemical mechanical polishing composition is capable of performing the chemical and mechanical polishing of a semiconductor substrate containing ruthenium while suppressing ruthenium corrosion and maintaining a stable polishing speed. Therefore, the semiconductor substrate, which is an object to be treated, preferably includes a part composed of at least one selected from the group consisting of ruthenium and a ruthenium alloy. Hereinafter, the polishing method according to the present embodiment will be described in detail with reference to FIG. 1 to FIG. 4.

Examples of the semiconductor substrate including a part composed of at least one selected from the group consisting of ruthenium and a ruthenium alloy include an object to be treated 100 as shown in FIG. 1. FIG. 1 shows a cross-sectional view schematically showing the object to be treated 100. The object to be treated 100 is produced by undergoing the following steps (1) to (4).

(1) First, as shown in FIG. 1, a base body 10 is prepared. The base body 10 may be composed of, for example, a silicon substrate and a silicon oxide film formed thereon. Furthermore, a functional device such as a transistor (not shown) may be formed on the base body 10. Next, a silicon oxide film 12, which is an insulating film, is formed on the base body 10 using a thermal oxidation method.

(2) Next, patterning is performed on the silicon oxide film 12. A wiring groove 14 is formed on the silicon oxide film 12 by a photolithography method using the obtained pattern as a mask.

(3) Next, a ruthenium-containing film 16 is formed on the surface of the silicon oxide film 12 and the inner wall surface of the wiring groove 14. The ruthenium-containing film 16 can be formed by, for example, a chemical vapor deposition method (CVD) or atomic layer deposition method (ALD) in which a ruthenium precursor is used or a physical vapor deposition method (PVD) such as sputtering.

(4) Next, a copper film 18 having a film thickness of 10,000 to 15,000 angstroms (here, "angstrom" refers to 0.1 nm) is deposited by a chemical deposition method or an electroplating method. As a material of the copper film 18, not only highly pure copper but also an alloy containing copper can be used. The amount of copper in the alloy containing copper is preferably 95 mass % or more.

Subsequently, a first polishing step of the object to be treated 100 is performed. FIG. 2 is a cross-sectional view schematically showing the object to be treated 100 at the time of the end of the first polishing step. As shown in FIG. 2, in the first polishing step, the copper film 18 is polished using a chemical mechanical polishing composition for a copper film until the ruthenium-containing film 16 is exposed. Examples of the chemical mechanical polishing composition for a copper film include a chemical mechanical polishing water-based dispersion described in Japanese Patent Laid-Open No. 2010-153790.

Subsequently, a second polishing step of the object to be treated 100 is performed. FIG. 3 is a cross-sectional view schematically showing the object to be treated 100 at the time of the end of the second polishing step. As shown in FIG. 3, in the second polishing step, the ruthenium-containing film 16, the copper film 18 and the silicon oxide film 12 are partially polished using the chemical mechanical polishing composition of the present invention.

Figure 4:
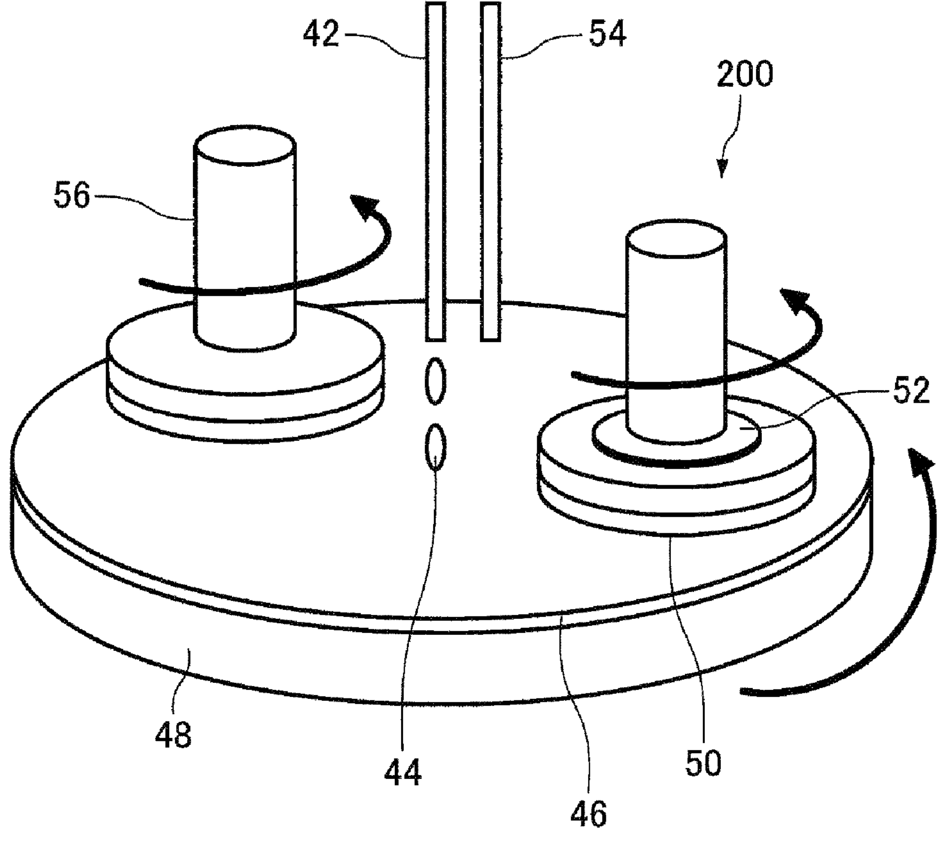
FIG. 4 is a perspective view schematically showing a chemical mechanical polishing device.

In the first polishing step and the second polishing step, for example, a polishing device 200 as shown in FIG. 4 can be used. FIG. 4 is a perspective view schematically showing the polishing device 200. The first polishing step and the second polishing step are performed by supplying a slurry (chemical mechanical polishing composition) 44 from a slurry supply nozzle 42 and bringing a carrier head 52 holding a semiconductor substrate 50 into contact with a turn table 48 to which a polishing pad 46 is stuck while the turn table 48 is being rotated. In FIG. 4, a water supply nozzle 54 and a dresser 56 are also shown.

The material of the polishing pad 46 may be any of a foam polyurethane type, a non-woven fabric type or a suede type, but is preferably a foam polyurethane type.

The polishing load of the carrier head 52 can be selected within a range of 0.7 to 70 psi and is preferably 1.5 to 35 psi. In addition, the rotation speeds of the turn table 48 and the carrier head 52 can be selected as appropriated within a range of 10 to 400 rpm and is preferably 30 to 150 rpm. The lower limit value of the flow rate of the chemical mechanical polishing composition that is supplied from the slurry supply nozzle 42 is 15 mL/minute and preferably 50 mL/minute, and the upper limit value of the flow rate is 400 mL/minute and preferably 300 mL/minute.

Examples of commercially available polishing devices include Model Nos. "EPO-112" and "F-REX300SII" manufactured by Ebara Corporation; Model Nos. "LGP-510" and "LGP-552" manufactured by Lap Master SFT Ltd.; Model Nos. "Mirra" and "Reflexion" manufactured by Applied Materials, Inc.; Model No. "POLI-400L" manufactured by G&P Technology, Inc.; Model No. "Reflexion LK" manufactured by Applied Materials, Inc.; and the like.

3. Examples

Hereinafter, the present invention will be more specifically described with examples, but the present invention is not limited to these examples by any means. "Parts" and "%" in the present examples are mass-based unless particularly otherwise described.

3.1. Preparation of Silica Particle Water Dispersion

3.1.1. Preparation of Water Dispersion A

25% Ammonia water (manufactured by Fujifilm Wako Pure Chemical Corporation) was added to 2000 g of PL-3 (manufactured by Fuso Chemical Co., Ltd., 19.5% colloidal silica dispersion liquid) to adjust the pH to nine. After that, 3.9 g of a (3-triethoxysilyl) mercapto group-containing silane coupling agent (trade name "KBM-803", manufactured by Shin-Etsu Chemical Co., Ltd.) was added dropwise thereto and stirred at 60° C. for two hours. After that, 50 g of hydrogen peroxide (manufactured by Fujifilm Wako Pure Chemical Corporation) was added thereto and refluxed under normal pressure for eight hours, thereby obtaining a water dispersion A containing cocoon-like silica particles having surfaces modified with a sulfo group and having an average particle diameter of 58 nm.

3.1.2. Preparation of Water Dispersion B 2000 g of PL-3 (manufactured by Fuso Chemical Co., Ltd., 19.5% colloidal silica dispersion liquid) was heated to 60° C. After that, 15.5 g of 3-(triethoxysilyl)propylsuccinic anhydride (manufactured by Tokyo Chemical Industry Co., Ltd.) was added thereto and further stirred at 60° C. for four hours, thereby obtaining a water dispersion B containing cocoon-like silica particles having surfaces modified with a carboxy group and having an average particle diameter of 60 nm.

3.1.3. Preparation of Water Dispersion C

A liquid mixture of 70 g of methanol and 11.3 g of 3-aminopropyltriethoxysilane (manufactured by Tokyo Chemical Industry Co., Ltd.) was added dropwise to 2000 g of PL-3 (manufactured by Fuso Chemical Co., Ltd., 19.5% colloidal silica dispersion liquid) and refluxed under normal pressure for two hours. After that, pure water was added dropwise thereto while maintaining the volume constant, and the dropwise addition of pure water was ended at a point in time where the tower top temperature reached 100° C., thereby obtaining a water dispersion C containing cocoon-like silica particles having surfaces modified with an amino group and having an average particle diameter of 56 nm.

3.1.4. Preparation of Water Dispersion D

25% Ammonia water (manufactured by Fujifilm Wako Pure Chemical Corporation) was added to 1950 g of PL-2L (manufactured by Fuso Chemical Co., Ltd., 20% colloidal silica dispersion liquid) to adjust the pH to nine. After that, 3.9 g of a (3-triethoxysilyl) mercapto group-containing silane coupling agent (trade name "KBM-803", manufactured by Shin-Etsu Chemical Co., Ltd.) was added dropwise thereto and stirred at 60° C. for two hours. After that, 50 g of hydrogen peroxide (manufactured by Fujifilm Wako Pure Chemical Corporation) was added thereto and refluxed under normal pressure for eight hours, thereby obtaining a water dispersion A containing spherical silica particles having surfaces modified with a sulfo group and having an average particle diameter of 23 nm.

3.1.5. Preparation of Water Dispersion E

PL-3 (manufactured by Fuso Chemical Co., Ltd., 19.5% colloidal silica dispersion liquid) was used as it was as a water dispersion E containing silica particles having unmodified surfaces and having an average particle diameter of 60 nm.

3.2. Preparation of Chemical Mechanical Polishing Composition

Each component was mixed so that the composition became as shown in Table 1 to Table 3, furthermore, the pH was adjusted to become as shown in Table 1 to Table 3 by adding a potassium hydroxide aqueous solution (manufactured by Kanto Chemical Co., Inc., trade name "48% Potassium Hydroxide Aqueous Solution") and phosphoric acid (manufactured by Fujifilm Wako Pure Chemical Corporation, trade name "Phosphoric Acid") as necessary, and pure water was added thereto so that the total amount of all of the component became 100 mass %, thereby preparing a chemical mechanical polishing composition of each of examples and comparative examples. For each of the chemical mechanical polishing compositions thus obtained, the zeta potential of abrasive grains was measured using a zeta potential measuring instrument (Model No. "DT300" manufactured by Dispersion Technology Inc.), and the results are summarized in Table 1 to Table 3.

3.3. Evaluation Methods

3.3.1. Polishing Speed Evaluation

A chemical mechanical polishing test was performed under the following conditions on a ruthenium film 100 nm-attached wafer having a diameter of 12 inches as an object to be polished using the chemical mechanical polishing composition prepared above.

(Polishing Conditions)

- Polishing device: Manufactured by Ebara Corporation, Model No. "F-REX300SII"
- Polishing pad: Manufactured by DuPont, "porous polyurethane pad; Optivision 9500 CMP Polishing pad"
- Supply speed of chemical mechanical polishing composition: 250 mLminute
- Surface plate rotation speed: 100 rpm
- Head rotation speed: 90 rpm
- Head pressing pressure: 2 psi
- Polishing time: 60 seconds $$\text{Polishing speed (nm/minute)} = (\text{thickness (nm) of film before polishing} - \text{thickness (nm) of film after polishing})/\text{polishing time (minute)}$$

The thickness of the ruthenium film was calculated by the following equation from this sheet resistance value and the volume resistivity of ruthenium after the resistance was measured by a DC four-terminal method with a resistivity measuring instrument (manufactured by KLA Corporation, Model No. "RS-100").

$$\text{Thickness (nm) of ruthenium film} = [\text{volume resistivity } (\Omega \cdot m) \text{ of ruthenium film} \div \text{sheet resistance value } (\Omega/\text{sq})] \times 10^9$$

The evaluation criteria of the polishing speed of the ruthenium film are as described below. The evaluation results of the polishing speeds of the ruthenium films are summarized in Table 1 to Table 3.

(Evaluation Criteria)

- A: In a case where the polishing speed was 1000 nm/minute or faster, the polishing speed was determined to be extremely favorable.
- B: In a case where the polishing speed was 50 nm/minute or faster and slower than 1000 nm/minute, the polishing speed was practically usable and thus determined to be favorable.
- C: In a case where the polishing speed was slower than 50 nm/minute, the polishing speed was slow and unsuitable for practical use and thus determined to be poor.

3.3.2. Etching Speed Evaluation

The chemical mechanical polishing composition prepared above was heated to 60° C., and a ruthenium film 100 nm-attached wafer piece cut to 30 mm×10 mm was immersed therein for five minutes. After that, the wafer piece was removed and washed with running water, and the thickness of the ruthenium film was measured by the same method as in the "3.3.1. polishing speed evaluation." In addition, the etching speed was calculated by the following equation from a change in the thickness of the ruthenium film before and after the immersion.

$$\text{Etching speed (nm/minute) of ruthenium film} = (\text{thickness (nm) of ruthenium film before etching} - \text{thickness (nm) of ruthenium film after etching})/\text{etching time (minute)}$$

The evaluation criteria of the etching speed of the ruthenium film are as described below. The evaluation results of the etching speeds of the ruthenium films are summarized in Table 1 to Table 3.

(Evaluation Criteria)

- A: In a case where the etching speed was slower than 1.5 nm/minute, the etching speed was determined to be extremely favorable.
- B: In a case where the etching speed was 1.5 nm/minute or faster and slower than 3 nm/minute, the etching speed was practically usable and thus determined to be favorable.
- C: In a case where the etching speed was 3 nm/minute or faster, the etching speed was fast and unsuitable for practical use and thus determined to be poor.

3.3.3. Preservation Stability Evaluation

The chemical mechanical polishing composition prepared above was stored in a constant temperature storage at 20° C. for three days or for seven days, and then a chemical mechanical polishing test was performed under the same conditions as in the "3.3.1. polishing speed evaluation" on a ruthenium film 100 nm-attached wafer having a diameter of 12 inches as an object to be polished. In addition, the change rate of the polishing speed of the ruthenium film before and after the storage was calculated by the following equation.

$$\text{Change rate (\%)} = |((\text{polishing speed calculated in the "3.3.1. polishing speed evaluation" section}) - (\text{polishing speed in case of using chemical mechanical polishing composition after storage})/(\text{polishing speed calculated in the "3.3.1. polishing speed evaluation" section}) \times 100|$$

The evaluation criteria of the change rate are as described below. The evaluation results of the preservation stability of the chemical mechanical polishing compositions are summarized in Table 1 to Table 3.

(Evaluation Criteria)

- A: In a case where the change rate of the polishing speed was less than 10% when seven days had elapsed from the storage, the preservation stability was determined to be extremely favorable.
- B: In a case where the change rate of the polishing speed was less than 10% when three days had elapsed from the storage, but the change rate of the polishing speed was 10% or more when seven days had elapsed from the storage, the preservation stability was practically usable and thus determined to be favorable.
- C: In a case where the change rate of the polishing speed was 10% or more when three days had elapsed from the storage, the preservation stability was unsuitable for practical use and thus determined to be poor.

3.4. Evaluation Results

The composition and each evaluation result of the chemical mechanical polishing composition used in each of the examples and the comparative examples are shown in Table 1 to Table 3.

TABLE 1

| | | | Example 1 | Example 2 | Example 3 | Example 4 | Example 5 | Example 6 | Example 7 | Example 8 | Example 9 |
|---|---|---|---|---|---|---|---|---|---|---|---|
| Chemical mechanical polishing composition | Abrasive grains (A) | Kind | Water dispersion A | Water dispersion A | Water dispersion A | Water dispersion A | Water dispersion D | Water dispersion B | Water dispersion B | Water dispersion C | Water dispersion A |
| | | Kind of functional group | Sulfo group | Sulfo group | Sulfo group | Sulfo group | Sulfo group | Carboxy group | Carboxy group | Amino group | Sulfo group |
| | | Zeta potential (mV) | −38 | −38 | −38 | −38 | −40 | −23 | −23 | −10 | −38 |
| | | Average particle diameter (nm) | 58 | 58 | 58 | 58 | 23 | 60 | 60 | 56 | 58 |
| | | Amount (mass %) | 0.1 | 0.1 | 2.5 | 0.5 | 5.0 | 2.0 | 3.0 | 3.0 | 0.1 |
| | Acid containing specific anion species or salt thereof (B) | Kind | $H_5IO_6$ | $H_5IO_6$ | $H_5IO_6$ | $H_5IO_6$ | $H_5IO_6$ | $H_5IO_6$ | $H_5IO_6$ | $H_5IO_6$ | $H_5IO_6$ |
| | | Specific anion species | $IO_4^-$ | $IO_4^-$ | $IO_4^-$ | $IO_4^-$ | $IO_4^-$ | $IO_4^-$ | $IO_4^-$ | $IO_4^-$ | $IO_4^-$ |
| | | Amount (mass %) | 0.3 | 0.3 | 0.3 | 0.4 | 0.1 | 0.3 | 0.4 | 0.3 | 0.2 |
| | | Amount MB (mol/L) | 0.0132 | 0.0132 | 0.0132 | 0.0175 | 0.0044 | 0.0132 | 0.0175 | 0.0132 | 0.0088 |
| | Hydrogen peroxide (C) | Amount MC (mol/L) | 0.0036 | 0.0036 | 0.0904 | 0.0181 | 0.2794 | 0.0029 | 0.0044 | 0.0044 | 0.0036 |
| | Compound (D) | Kind | N-(phosphonomethyl)-iminodiacetic acid | N-(phosphonomethyl)-iminodiacetic acid | Hydroxyethyl-iminodiacetic acid | Hydroxyethyl-iminodiacetic acid | Hydroxyethyl-iminodiacetic acid | N-(phosphonomethyl)-iminodiacetic acid | Hydroxyethyl-iminodiacetic acid | Hydroxyethyl-iminodiacetic acid | N-(2-carboxyethyl)-iminodiacetic acid |
| | | Amount (mass %) | 0.2 | 0.8 | 0.15 | 0.15 | 0.15 | 0.2 | 0.2 | 0.2 | 0.15 |
| | Other components | Kind | | | | | | | | | |
| | | Amount (mass %) | | | | | | | | | |
| | MB (mol/L)/MC (mol/L) | | 3.64 | 3.64 | 0.15 | 0.97 | 0.02 | 4.47 | 3.98 | 2.98 | 2.43 |
| | pH | | 7.5 | 7.5 | 7.5 | 7.5 | 7.5 | 7.5 | 7.5 | 7.5 | 7.0 |
| Evaluation results | Ru polishing speed evaluation | | A | A | A | A | A | A | A | A | A |
| | Ru etching speed evaluation | | A | A | A | A | A | A | A | A | B |
| | Preservation stability evaluation | | A | B | B | B | B | A | A | A | A |

TABLE 2

| | | | Example 10 | Example 11 | Example 12 | Example 13 | Example 14 | Example 15 | Example 16 | Example 17 | Example 18 |
|---|---|---|---|---|---|---|---|---|---|---|---|
| Chemical mechanical polishing composition | Abrasive grains (A) | Kind | Water dispersion B | Water dispersion C | Water dispersion D | Water dispersion E | Water dispersion E | Water dispersion E | Water dispersion A | Water dispersion A | Water dispersion A |
| | | Kind of functional group | Carboxy group | Amino group | Sulfo group | — | — | — | Sulfo group | Sulfo group | Sulfo group |

TABLE 2-continued

| | | | Example 10 | Example 11 | Example 12 | Example 13 | Example 14 | Example 15 | Example 16 | Example 17 | Example 18 |
|---|---|---|---|---|---|---|---|---|---|---|---|
| | | Zeta potential (mV) | −19 | −16 | −45 | −35 | −30 | −38 | −38 | −38 | −38 |
| | | Average particle diameter (nm) | 60 | 56 | 23 | 60 | 60 | 60 | 58 | 58 | 58 |
| | | Amount (mass %) | 0.8 | 0.6 | 0.2 | 2.0 | 2.0 | 2.0 | 0.1 | 0.1 | 0.1 |
| | Acid containing specific anion species or salt thereof (B) | Kind | $H_5IO_6$ | $H_5IO_6$ | $H_5IO_6$ | $H_5IO_6$ | $H_5IO_6$ | $H_5IO_6$ | KClO | $KClO_2$ | NaBrO |
| | | Specific anion species | $IO_4$ | $IO_4$ | $IO_4$ | $IO_4$ | $IO_4$ | $IO_4$ | ClO | $ClO_2$ | BrO |
| | | Amount (mass %) | 0.1 | 0.2 | 0.1 | 0.1 | 0.2 | 0.1 | 0.3 | 0.3 | 0.3 |
| | | Amount MB (mol/L) | 0.0044 | 0.0088 | 0.0044 | 0.0044 | 0.0088 | 0.0044 | 0.0331 | 0.0282 | 0.0252 |
| | Hydrogen peroxide (C) | Amount MC (mol/L) | 0.0012 | 0.0009 | 0.0112 | 0.0029 | 0.0029 | 0.0029 | 0.0036 | 0.0036 | 0.0036 |
| | Compound (D) | Kind | Nitrilotriacetic acid | 3,3',3''-Nitrilotripropionic acid | Ethylene diamine-tetraacetic acid | Tetrasodium L-glutamic acid diacetate | Glycine-N,N-bis(methylenephosphonic acid) | Glycol ether diamine tetraacetic acid | N-(phosphonomethyl)-iminodiacetic acid | N-(phosphonomethyl)-iminodiacetic acid | N-(phosphonomethyl)-iminodiacetic acid |
| | | Amount (mass %) | 0.16 | 0.175 | 0.25 | 0.295 | 0.225 | 0.32 | 0.2 | 0.2 | 0.2 |
| | Other components | Kind | | | | | | | | | |
| | | Amount (mass %) | | | | | | | | | |
| | MB (mol/L)/MC (mol/L) | | 3.73 | 9.94 | 0.39 | 1.49 | 2.98 | 1.49 | 9.16 | 7.78 | 6.98 |
| | pH | | 6.0 | 9.0 | 8.0 | 11.0 | 10.0 | 12.0 | 7.5 | 7.5 | 7.5 |
| Evaluation results | Ru polishing speed evaluation | | A | B | A | B | B | B | A | A | A |
| | Ru etching speed evaluation | | B | B | B | B | B | B | A | A | A |
| | Preservation stability evaluation | | A | A | B | B | B | B | A | A | A |

TABLE 3

| | | | Comparative Example 1 | Comparative Example 2 | Comparative Example 3 | Comparative Example 4 | Comparative Example 5 |
|---|---|---|---|---|---|---|---|
| Chemical mechanical functional polishing composition | Abrasive grains (A) | Kind | Water dispersion A | Water dispersion A | Water dispersion A | Water dispersion A | Water dispersion E |
| | | Kind of functional group | Sulfo group | Sulfo group | Sulfo group | Sulfo group | — |
| | | Zeta potential (mV) | −38 | −38 | −23 | −38 | −23 |
| | | Average particle diameter (nm) | 58 | 58 | 58 | 58 | 60 |

TABLE 3-continued

| | | | Comparative Example 1 | Comparative Example 2 | Comparative Example 3 | Comparative Example 4 | Comparative Example 5 |
|---|---|---|---|---|---|---|---|
| | | Amount (mass %) | 0.1 | 0.1 | 2.5 | 2.5 | 0.1 |
| | Acid containing specific anion species or salt thereof (B) | Kind | — | — | $H_5IO_6$ | $H_5IO_6$ | $H_5IO_6$ |
| | | Specific anion species | — | — | $IO_4^-$ | $IO_4^-$ | $IO_4^-$ |
| | | Amount (mass %) | — | — | 1.0 | 0.03 | 1.0 |
| | | Amount MB (mol/L) | — | — | 0.0439 | 0.0013 | 0.0439 |
| | Hydrogen peroxide (C) | Amount MC (mol/L) | 0.0036 | 0.0036 | 0.0037 | 0.0904 | 0.0001 |
| | Compound (D) | Kind | Hydroxy-ethylethylene-diamine triacetic acid | Hydroxy-ethylethylene-diamine triacetic acid | N-(phosphono-methyl)imino-diacetic acid | Hydroxy-ethylimino-diacetic acid | N-(phosphono-methyl)imino-diacetic acid |
| | | Amount (mass %) | 0.235 | 0.235 | 0.2 | 0.15 | 0.2 |
| | Other compo nents | Kind | $KIO_3$ | $(NH_4)_2S_2O_8$ | | | |
| | | Amount (mass %) | 0.2 | 0.2 | | | |
| | MB (mol/L)/ MC (mol/L) | | — | — | 11.93 | 0.01 | 298.32 |
| | pH | | 7.5 | 7.5 | 7.5 | 7.5 | 7.5 |
| Evalu-ation results | Ru polishing speed evaluation | | C | C | A | C | A |
| | Ru etching speed evaluation | | A | A | C | A | C |
| | Preservation stability evaluation | | A | A | A | C | C |

As each of the components in Table 1 to Table 3, each of the following commercially available products or reagents was used.

<Component (A)>

Water dispersions A to E: Water dispersions A to E prepared in the "3.1. preparation of silica particle water dispersion" section.

<Component (B)>

$H_5IO_6$ (orthoperiodic acid): Manufactured by Fujifilm Wako Pure Chemical Corporation, trade name "Ortho-periodic Acid"

KClO (potassium hypochlorite): Manufactured by Kanto Chemical Co., Inc., trade name "Potassium Hypochlorite"

$KClO_2$ (potassium chlorite): Manufactured by Angene, trade name "Potassium Chlorite"

NaBrO (sodium hypobromite): Manufactured by Kanto Chemical Co., Inc., trade name "Sodium Hypobromite"

<Component (C)>

Hydrogen peroxide: Manufactured by Fujifilm Wako Pure Chemical Corporation, 30% aqueous solution <Component (D)>

N-(phosphonomethyl)iminodiacetic acid: Manufactured by Sigma-Aldrich Co. LLC., trade name "N-(phosphonomethyl)iminodiacetic Acid"

Hydroxyethyliminodiacetic acid: Manufactured by Tokyo Chemical Industry Co., Ltd., trade name "N-(2-Hydroxyethyl)iminodiacetic Acid"

N-(2-carboxyethyl)iminodiacetic acid: Manufactured by Tokyo Chemical Industry Co., Ltd., trade name "N-(2-carboxyethyl)iminodiacetic Acid"

Nitrilotriacetic acid: Manufactured by Tokyo Chemical Industry Co., Ltd., trade name "Nitrilotriacetic Acid"

3,3',3"-Nitrilotripropionic acid: Manufactured by Tokyo Chemical Industry Co., Ltd., trade name "3,3',3"-Nitrilotripropionic Acid"

Ethylenediaminetetraacetic acid: Manufactured by Tokyo Chemical Industry Co., Ltd., trade name "Ethylenediaminetetraacetic Acid"

Tetrasodium L-glutamic acid diacetate: Manufactured by Tokyo Chemical Industry Co., Ltd., trade name "Tetrasodium N,N-Bis(carboxymethyl)-L-glutamate (ca. 40% in Water)"

Glycine-N,N-bis(methylenephosphonic acid): Manufactured by Tokyo Chemical Industry Co., Ltd., trade name "Glycine-N,N-bis(methylenephosphonic Acid)"

Glycol ether diamine tetraacetic acid: Manufactured by Tokyo Chemical Industry Co., Ltd., trade name "Ethylene Glycol Bis(2-aminoethyl Ether)-N,N,N',N'-tetraacetic Acid"

Hydroxyethylethylenediamine triacetic acid: Manufactured by Tokyo Chemical Industry Co., Ltd., trade name "N-(2-Hydroxyethyl)ethylenediamine-N,N',N'-triacetic Acid"

<Other Components>

$KIO_3$ (potassium iodate): Manufactured by Fujifilm Wako Pure Chemical Corporation, trade name "Potassium Iodate"

$(NH_4)_2S_2O_8$(ammonium persulfate): Manufactured by Fujifilm Wako Pure Chemical Corporation, trade name "Ammonium Persulfate"

It is found that, according to the chemical mechanical polishing compositions of Examples 1 to 18 where MB/MC was within a range of 0.015 to 11, the component (B) is capable of improving the polishing speed of the ruthenium film by oxidizing ruthenium, the component (C) reacts with ruthenium and is thereby capable of preventing the excessive reaction between ruthenium and a specific anion species that is contained in the component (B) and ruthenium corrosion can be suppressed.

In contrast, it is found that, according to the chemical mechanical polishing compositions of Comparative Examples 1 and 2 where a compound containing no specific anion species was contained, since ruthenium cannot be effectively oxidized, the polishing speed of the ruthenium film become slow. It is found that, according to the chemical mechanical polishing compositions of Comparative Examples 3 and 5 where MB/MC was more than 11, since the amount of the component (B) is too large relative to the amount of the component (C), ruthenium corrosion is induced due to the excess amount of the component (B). It is found that, according to the chemical mechanical polishing composition of Comparative Example 4 where MB/MC was less than 0.015, since the amount of the component (B) is too small relative to the amount of the component (C), since ruthenium cannot be effectively oxidized, the polishing speed of the ruthenium film become slow.

The present invention is not limited to the above-described embodiments and can be modified in a variety of manners. For example, the present invention includes substantially the same configuration (for example, a configuration having the same function, method and result or a configuration having the same objective and effect) as the configuration described in an embodiment. In addition, the present invention includes a configuration obtained by replacing a part of the configuration described in an embodiment that is not essential. In addition, the present invention includes a configuration exhibiting the same action and effect or a configuration capable of achieving the same objective as the configuration described in an embodiment. In addition, the present invention includes substantially a configuration obtained by adding a well-known technique to the configuration described in an embodiment.

REFERENCE SIGNS LIST

10 Base body
12 Silicon oxide film
14 Wiring groove
16 Ruthenium-containing film
18 Copper film
42 Slurry supply nozzle
44 Slurry (chemical mechanical polishing composition)
46 Polishing pad
48 Turn table
50 Semiconductor substrate
52 Carrier head
54 Water supply nozzle
56 Dresser
100 Object to be treated
200 Polishing device

The invention claimed is:

1. A chemical mechanical polishing composition comprising:

silica particles (A);

an acid containing at least one anion selected from the group consisting of periodate ions ($IO_4^-$), hypochlorite ions ($ClO^-$), chlorite ions ($ClO_2^-$) and hypobromite ions ($BrO^-$) or a salt thereof (B); and hydrogen peroxide (C), wherein MB/MC=0.015 to 11, where MB (mol/L) is an amount of the acid or salt thereof (B) and MC (mol/L) is an amount of hydrogen peroxide (C), wherein the silica particles (A) have a functional group represented by the following general formula (1), (2), (3) or (4):

(1)

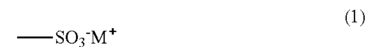

(2)

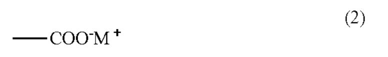

(in the general formulae (1) and (2), $M^+$ represents a monovalent cation), (3)

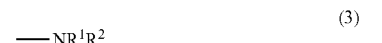

(4)

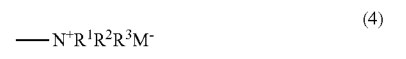

(in the general formulae (3) and (4), $R^1$, $R^2$ and $R^3$ each independently represent a hydrogen atom or a substituted or unsubstituted hydrocarbon group, and M-represents an anion).

2. The chemical mechanical polishing composition according to claim 1, wherein the silica particles (A) in the chemical mechanical polishing composition have an absolute value of a zeta potential of 10 mV or higher.

3. The chemical mechanical polishing composition according to claim 2, wherein MB (mol/L) is 0.001 to 0.05 mol/L.

4. The chemical mechanical polishing composition according to claim 2, wherein pH is 6 or higher and 12 or lower.

5. The chemical mechanical polishing composition according to claim 1, wherein MB (mol/L) is 0.001 to 0.05 mol/L.

6. The chemical mechanical polishing composition according to claim 5, wherein pH is 6 or higher and 12 or lower.

7. The chemical mechanical polishing composition according to claim 1, wherein pH is 6 or higher and 12 or lower.

8. A polishing method comprising:

a step of polishing a semiconductor substrate using the chemical mechanical polishing composition according to claim 1.

9. The polishing method according to claim 8, wherein the semiconductor substrate includes a part composed of at least one selected from the group consisting of ruthenium and a ruthenium alloy.

* * * * *